(12) United States Patent
Igarashi (10) Patent No.: US 6,710,384 B2
(45) Date of Patent: Mar. 23, 2004

(54) SEMICONDUCTOR MEMORY DEVICE

(75) Inventor: Yasushi Igarashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/917,621

(22) Filed: Jul. 31, 2001

(65) Prior Publication Data

US 2002/0017723 A1 Feb. 14, 2002

Related U.S. Application Data

(62) Division of application No. 09/580,642, filed on May 30, 2000, now Pat. No. 6,291,250.

(30) Foreign Application Priority Data

Jun. 3, 1999 (JP) ............................................. 11-156629

(51) Int. Cl.[7] ....................... H01L 29/76; H01L 27/108; H01L 23/48; H01L 21/00; H01L 21/8242
(52) U.S. Cl. ....................... 257/295; 257/295; 257/310; 257/751; 257/753; 438/3; 438/240
(58) Field of Search ............................ 438/3, 240, 253, 438/254, 396, 397, 398; 257/296, 295, 306, 310, 324, 751, 753, 763, 757, 761

(56) References Cited

U.S. PATENT DOCUMENTS

| | | | | |
|---|---|---|---|---|
| 5,539,256 A | * | 7/1996 | Mikagi | 257/763 |
| 5,541,441 A | * | 7/1996 | Yeuochung et al. | 257/530 |
| 5,550,427 A | * | 8/1996 | Hayashi | 313/355 |
| 5,847,459 A | * | 12/1998 | Taniguchi | 257/751 |
| 5,959,327 A | * | 9/1999 | Sandhu et al. | 257/310 |
| 5,972,722 A | * | 10/1999 | Visokay et al. | 438/3 |
| 5,981,331 A | * | 11/1999 | Tsunemine | 438/240 |
| 6,020,644 A | * | 2/2000 | Tanigawa | 257/775 |
| 6,090,697 A | * | 7/2000 | Xing et al. | 438/618 |
| 6,107,136 A | * | 8/2000 | Melnick et al. | 438/253 |
| 6,111,318 A | * | 8/2000 | Hoshino | 257/741 |
| 6,117,689 A | * | 9/2000 | Summerfelt | 438/3 |
| 6,172,387 B1 | * | 1/2001 | Thakur et al. | 257/296 |
| 6,246,082 B1 | * | 6/2001 | Mitarai et al. | 257/295 |
| 6,258,654 B1 | * | 7/2001 | Gocho | 438/240 |
| 6,281,537 B1 | * | 8/2001 | Kim | 257/295 |
| 6,313,539 B1 | * | 11/2001 | Yokoyama et al. | 257/761 |
| 6,403,441 B1 | * | 6/2002 | Takehiro et al. | 438/396 |

FOREIGN PATENT DOCUMENTS

| | | | |
|---|---|---|---|
| JP | 1-282862 | * | 11/1989 |
| JP | 2-116124 | * | 4/1990 |
| JP | 2-159033 | * | 6/1990 |

OTHER PUBLICATIONS

Yamazaki et al., "Advanced 0.5 $\mu$m FRAM Device Technology with full Capatability of Half–Micron CMOS Logic Device", IEDM Digest of Technology Papers, 1997, pp. 613–616.

* cited by examiner

Primary Examiner—Matthew Smith
Assistant Examiner—Chuong A Luu
(74) Attorney, Agent, or Firm—Venable; James R. Burdett (57) ABSTRACT

The wiring structure provided to the semiconductor memory device comprises a main wiring layer and barrier metal layer each established in the substrate and is connected to the lower electrode of a capacitive element. The main wiring layer and lower electrode are isolated from each other by a barrier metal layer acting as a material impermeable to oxygen; as a result, the main wiring layer is not easily oxidized.

6 Claims, 8 Drawing Sheets

SEMICONDUCTOR MEMORY DEVICE

This nonprovisional application is a divisional of U.S. application Ser. No. 09/580,642, filed May 30, 2000 now U.S. Pat. No. 6,291,250.

BACKGROUND OF THE INVENTION

1. Field of the Invention

The present invention relates to a semiconductor memory device comprising a capacitive element and a method for the manufacture thereof.

1. Description of Related Art

The constitution of 1T-1C (single-transistor/single/capacitor) ferroelectric memory (FeRAM) is disclosed in "IEDM Digest of Technical Papers, 1997, pp. 613–616". In this example, a cell size of 12.5 $\mu m^2$ is achieved with a 0.5 $\mu$rule. This ferroelectric capacitor has a multilayered structure of Pt/PZT/Pt/TiN. The TiN layer of the upper electrode is connected via local wiring formed of TiN material and a W plug to one end of the main current path of a MOS transistor. The other end of the main current path of the MOS transistor is connected to a bit line.

The Pt layer is not oxidized during the heat treatment in oxygen which is necessary when forming a ferroelectric capacitor. Therefore, the Pt layer is also used as a plate line.

The Pt layer must be relatively thick because the plate line must have low resistance. As a result, expensive Pt is used in a large quantity, and chip costs become high.

SUMMARY OF THE INVENTION

It is an object of the present invention to provide a semiconductor memory device, having a structure wherein the wiring connected to the capacitive element is lower costs than that of the Pt wiring, and a method for the manufacture thereof.

In order to achieve this object, the semiconductor memory device relating to the present invention has the following type of unique constitution. In other words, the semiconductor memory device relating to the present invention comprises a base, capacitive element, and wiring structure. In the present invention, the capacitive element comprises a lower electrode and this lower electrode is provided on the upper surface of the base. Also, in the present invention, the wiring structure comprises a main wiring layer and barrier metal layer, both established in the base; this barrier metal layer is connected to the lower electrode. Furthermore, in the present invention, the main wiring layer and the lower electrode are isolated from each other by the barrier metal layer; this barrier metal layer serves as a material that is impermeable to oxygen.

With this constitution, because a barrier metal layer is established between the main wiring layer and lower electrode, the main wiring layer does not easily oxidize during formation of the capacitive element. Consequently, the electrical properties of the main wiring layer do not easily deteriorate.

According to a preferred embodiment of the semiconductor memory device relating to the present invention, the capacitive element may comprise a ferroelectric film and upper electrode layered in that order on the upper surface of the lower electrode.

According to another preferred embodiment of the semiconductor memory device relating to the present invention, the barrier metal layer may be a layer containing Ir or Pt.

This barrier metal layer may be an alloy or compound, so long as it is a layer containing Ir or Pt. Because Ir and Pt are materials into which oxygen does not easily diffuse, these serve as material that are impermeable to oxygen.

According to another preferred embodiment of the semiconductor memory device relating to the present invention, the main wiring layer may be a monolayered film of a single layer selected from among the following, or a multilayered film of a plurality of layers arbitrarily selected from among the following: W layer, Mo layer, Ta layer, Cu layer, $TiSi_2$ layer, $CoSi_2$ layer, $ZrSi_2$ layer, $WSi_2$ layer, $TaSi_2$ layer, $MoSi_2$ layer, polysilicon layer, TiN layer, ZrN layer, and TaN layer.

In this way, chip costs can be reduced through the use of materials that cost less than Pt as the main wiring layer.

A method for manufacturing the semiconductor memory device relating to the present invention includes the following steps. In the first step, a first conductive layer is deposited on the substrate. In the second step, the first conductive layer is patterned to form the wiring pattern. In the third step, an insulating film is deposited on the substrate whereon the wiring pattern has been formed. In the fourth step, the upper portion of the insulating film is removed to expose the upper surface of the first conductive layer. In the fifth step, the upper portion of the first conductive layer is removed and the level of the upper surface of the first conductive layer is made less than that of the upper surface of the insulating film. In the sixth step, a second conductive layer is built up using a material impermeable to oxygen on the portions where the first conductive layer was removed. In the seventh step, the upper portions of the second conductive layer and the insulating film are removed and the level of the second conductive layer is made even with the level of the upper surface of the insulating film. In the eighth step, the capacitive element is formed on the upper surface of the second conductive layer.

With such a method, the first conductive layer and capacitive element are isolated by a second conductive layer. So, even when heat treatment is performed in oxygen in the eighth step, the first conductive layer is not oxidized because the second conductive layer comprises material impermeable to oxygen. Consequently, the electrical properties of the first conductive layer do not deteriorate.

In application of the method for manufacturing the semiconductor memory device relating to the present invention, the second conductive layer preferably is a layer comprising Ir or Pt.

Because Ir and Pt are materials into which oxygen does not diffuse easily, they are used as materials impermeable to oxygen.

The first conductive layer is preferably a W layer and the insulating film is preferably an $SiO_2$ film.

Because Ir (or Pt) and W easily form alloys, these have good adhesion. Meanwhile, Ir (or Pt) and $SiO_2$ have bad adhesion. Consequently, the seventh step is easily performed because the second conductive layer and insulating film easily separate.

In application of the method for manufacturing the semiconductor memory device relating to the present invention, the first conductive layer is preferably a monolayered film of a single layer selected from among the following, or a multilayered film of a plurality of layers arbitrarily selected from among the following: W layer, Mo layer, Ta layer, Cu layer, $TiSi_2$ layer, $CoSi_2$ layer, $ZrSi_2$ layer, $WSi_2$ layer, $TaSi_2$ layer, $MoSi_2$ layer, polysilicon layer, TiN layer, ZrN layer, and TaN layer.

When such materials are used, costs become lower than when Pt is used.

Furthermore, in application of the method for manufacturing the semiconductor memory device relating to the present invention, chemical mechanical polishing is preferably used in the fourth and seventh stepes.

Since material that is difficult to dry etch is generally used as the second conductive layer, chemical mechanical polishing will make microfinishing of such material easier.

Another method for manufacturing the semiconductor memory device relating to the present invention includes the following steps. In the first step, trenches are formed in the insulating film according to a prescribed wiring pattern. In the second step, the first conductive layer is built up on the insulating film wherein the trenches have been formed. In the third step, the upper portion of the first conductive layer is removed and the level of the upper surface of the first conductive layer is made less than that of the upper surface of the insulating film. In the fourth step, a second conductive layer is built up using a material impermeable to oxygen on the portions where the first conductive layer was removed. In the fifth step, the upper portions of the second conductive layer and the insulating film are removed and the level of the second conductive layer is made even with the level of the upper surface of the insulating film. In the sixth step, the capacitive element is formed on the upper surface of the second conductive layer.

With such a method, the first conductive layer and capacitive element are isolated by a second conductive layer. So, even when heat treatment is performed in oxygen in the sixth step, the first conductive layer is not oxidized because the second conductive layer comprises material impermeable to oxygen. Consequently, the electrical properties of the first conductive layer do not deteriorate. Also, with the method relating to the present invention, the number of steps can be kept relatively low.

In application of the method for manufacturing the semiconductor memory device relating to the present invention, the second conductive layer preferably is a layer comprising Ir or Pt.

Because Ir and Pt are materials into which oxygen does not diffuse easily, they are used as materials impermeable to oxygen.

The first conductive layer is preferably a W layer and the insulating film is preferably an $SiO_2$ film.

Because Ir (or Pt) and W easily form alloys, these have good adhesion. Meanwhile, Ir (or Pt) and $SiO_2$ have bad adhesion. Consequently, the fifth step is easily performed because the second conductive layer and insulating film easily separate.

In application of the method for manufacturing the semiconductor memory device relating to the present invention, the first conductive layer is preferably a monolayered film of a single layer selected from among the following, or a multilayered film of a plurality of layers arbitrarily selected from among the following: W layer, Mo layer, Ta layer, Cu layer, $TiSi_2$ layer, $CoSi_2$ layer, $ZrSi_2$ layer, $WSi_2$ layer, $TaSi_2$ layer, $MoSi_2$ layer, polysilicon layer, TiN layer, ZrN layer, and TaN layer.

When such materials are used, costs become lower than when Pt is used.

Furthermore, in application of the method for manufacturing the semiconductor memory device relating to the present invention, chemical mechanical polishing is preferably used in the third and fifth steps.

Since a material that is difficult to dry etch is generally used as the second conductive layer, chemical mechanical polishing will make microfinishing easier.

BRIEF DESCRIPTION OF THE DRAWINGS

The foregoings and other objects, features and advantages of the present invention will be better understood from the following description taken in connection with the accompanying drawings in which:

FIG. 2 (including FIGS. 2(A), 2(B), and 2(C)) is a cross sectional view showing the steps for manufacturing the semiconductor memory device relating to the first embodiment;

FIG. 3 (including FIGS. 3(A), 3(B), and 3(C)) is a cross sectional view showing the steps for manufacturing the semiconductor memory device relating to the first embodiment;

FIG. 4 (including FIGS. 4(A), 4(B), and 4(C)) is a cross sectional view showing the steps for manufacturing the semiconductor memory device relating to the first embodiment;

FIG. 6 (including FIGS. 6(A), 6(B), and 6(C)) is a cross sectional view showing the steps for manufacturing the semiconductor memory device relating to the second embodiment;

FIG. 7 (including FIGS. 7(A), 7(B), and 7(C)) is a cross sectional view showing the steps for manufacturing the semiconductor memory device relating to the second embodiment; and FIG. 8 (including FIGS. 8(A) and 8(B)) is a cross sectional view showing the steps for manufacturing the semiconductor memory device relating to the second embodiment.

DESCRIPTION OF THE PREFERRED EMBODIMENTS

The preferred embodiments of the present invention are explained below with reference to the figures. The figures are merely to show forms, sizes, and positional relationships so that the present invention can be understood. The conditions, such as numerical values, and materials noted below are merely examples. Consequently, the scope of the present invention is in no way limited by these embodiments.

The semiconductor memory device explained with this embodiment comprises a wiring structure appropriate for increasing the level of integration. As explained below, FeRAM that is provided with a ferroelectric capacitor is used as an example of the semiconductor memory device in this embodiment.

First Embodiment

Figure 1:
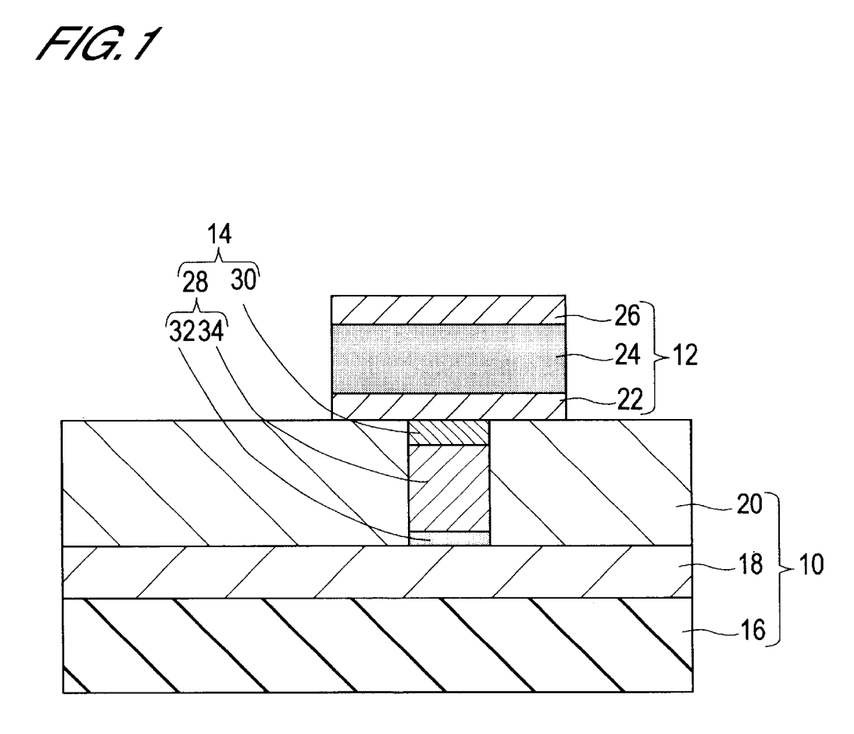
FIG. 1 is a cross sectional view showing the constitution of the semiconductor memory device relating to the first embodiment.

The constitution of the semiconductor memory device relating to the first embodiment is explained. FIG. 1 is a cross sectional view showing the principal elements constituting the semiconductor memory device relating to the first embodiment. As shown in FIG. 1, this semiconductor memory device comprises a base 10, capacitive element 12, and wiring structure 14. The base 10 comprises a substrate 16, interlayer insulating film 18, and $SiO_2$ film 20. The substrate 16 is a semiconductor substrate such as Si, for example. A control element, such as a MOS transistor (not shown) and wiring are formed on the substrate 16. Furthermore, the $SiO_2$ film 20 is layered on the upper surface of the interlayer insulating film 18.

The capacitive element 12 discussed above is a ferroelectric capacitor utilizing ferroelectric properties. The ferroelectric material has spontaneous polarization properties derived from a bistable liquid crystal structure. The capacitive element 12 can be caused to function as a memory element through the electrical control of this spontaneous polarization from outside.

This capacitive element 12 is established on the upper surface of the base 10 and comprises a lower electrode 22, ferroelectric film 24, and upper electrode 26 layered in that order. In other words, the lower electrode 22 is formed on the upper surface of the $SiO_2$ film 20 and the ferroelectric film 24 is layered on the upper surface of this lower electrode 22. The upper electrode 26 is then layered on the upper surface of this ferroelectric film 24. In this example, both the lower electrode 22 and upper electrode 26 are formed of $IrO_2$. The ferroelectric film 24 is formed of $SrBi_2Ta_2O_9$ (abbreviated below as SBT).

The wiring structure 14 comprises a main wiring layer 28 and barrier metal layer 30, both established in the base 10, and is connected to the lower electrode 22. In this example, the main wiring layer 28 is formed on the upper surface of the interlayer insulating film 18. The barrier metal layer 30 is layered on the upper surface of this main wiring layer 28. The main wiring layer 28 and barrier metal layer 30 are formed in identical patterns and overlaid. The side surfaces of the main wiring layer 28 and barrier metal layer 30 are covered by the $SiO_2$ film 20 discussed above. The level of the upper surface of this $SiO_2$ film 20 matches the level of the upper surface of the barrier metal layer 30. Consequently, the $SiO_2$ film 20 is not built up on the upper surface of the barrier metal layer 30. The lower electrode 22 discussed above is established above the barrier metal layer 30. The upper surface of the barrier metal layer 30 is in contact with the lower surface of the lower electrode 22.

The main wiring layer 28 has a two layer structure of a TiN layer 32 and a W layer 34. The TiN layer 32 is formed on the upper surface of the interlayer insulating film 18. The W layer 34 is formed on the upper surface of this TiN layer 32. The W layer 34 adheres to the TiN layer 32. The barrier metal layer 30 discussed above is then formed on the upper surface of this W layer 34. In addition, this main wiring layer 28 may be a monolayered film of a single layer selected from among the following, or a multilayered film of a plurality of layers arbitrarily selected from among the following: W layer, Mo layer, Ta layer, Cu layer, $TiSi_2$ layer, $CoSi_2$ layer, $ZrSi_2$ layer, $WSi_2$ layer, $TaSi_2$ layer, $MoSi_2$ layer, polysilicon layer, TiN layer, ZrN layer, and TaN layer. With the use of such materials, costs are lower than when Pt is used.

The semiconductor memory device relating to the present embodiment is constituted as explained above; as a result, the main wiring layer 28 and lower electrode 22 are isolated by a barrier metal layer 30. This barrier metal layer 30 is used as a material impermeable to oxygen. In other words, oxygen cannot pass through this barrier metal layer 30. Accordingly, oxygen does not diffuse into the lower electrode 22 during heat treatment performed during the manufacturing step and the electrical properties thereof will hardly deteriorate. The barrier metal layer 30 in this example is formed of Ir. The barrier metal layer 30 is not limited to that and may also be formed of other materials so long as it is a layer including Ir or Pt.

Figure 2A:
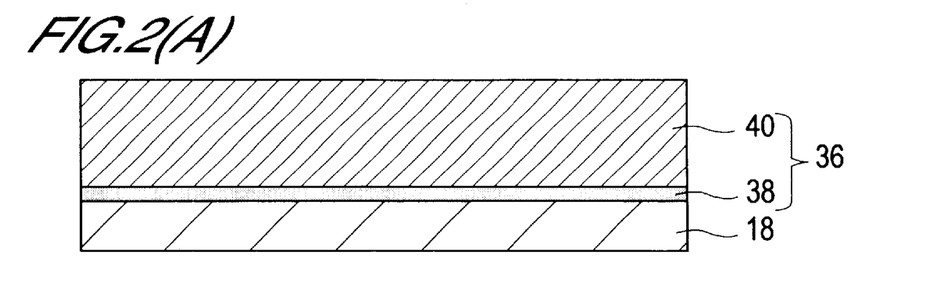
Figure 2B:
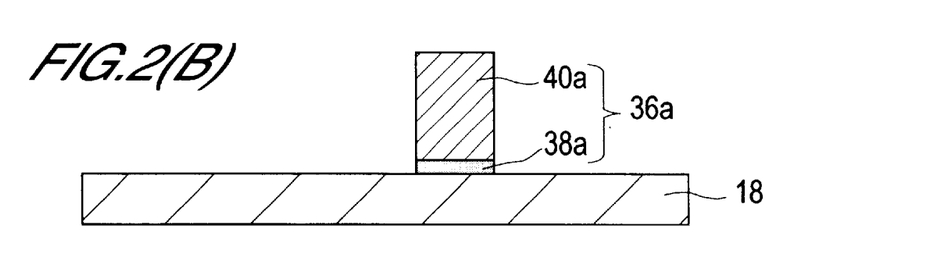
Figure 2C:
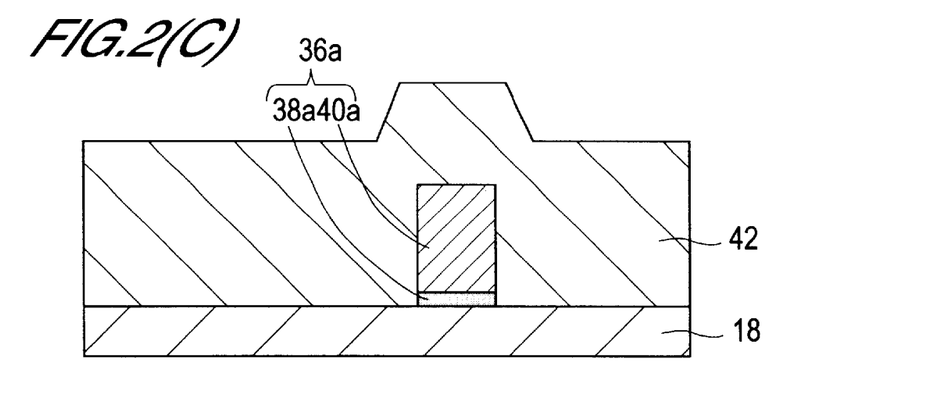
Figure 3A:
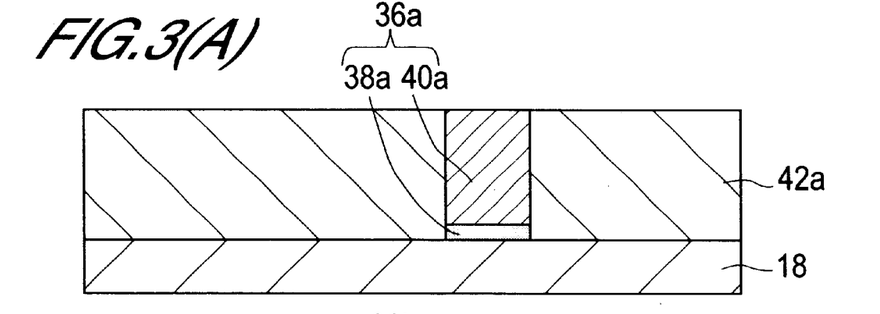
Figure 3B:
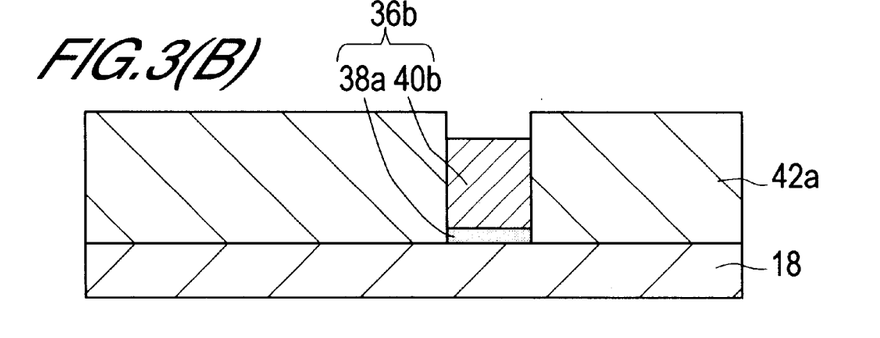
Figure 3C:
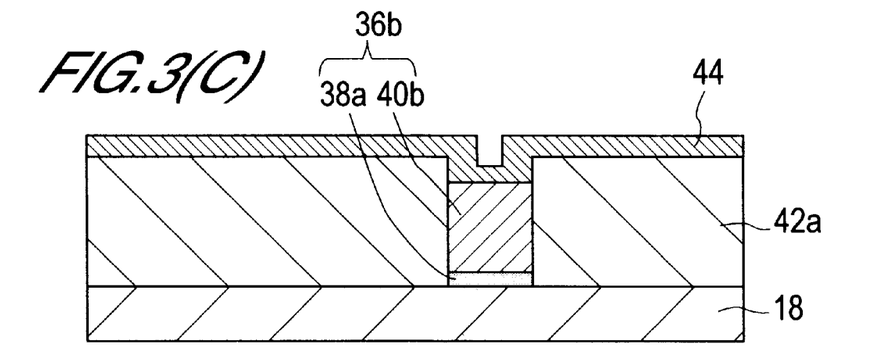
Figure 4A:
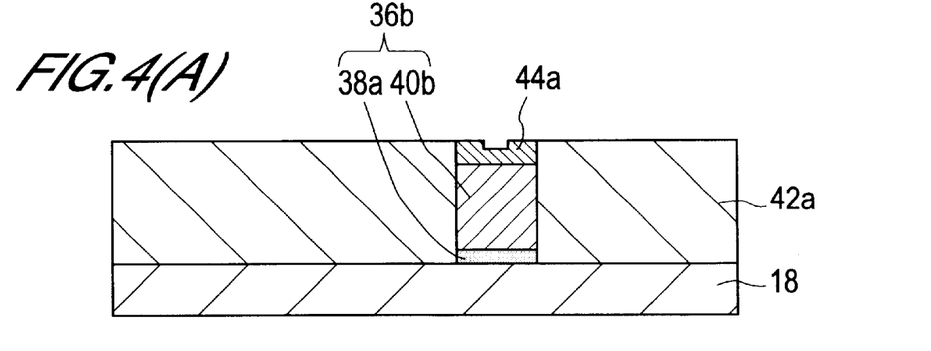
Figure 4B:
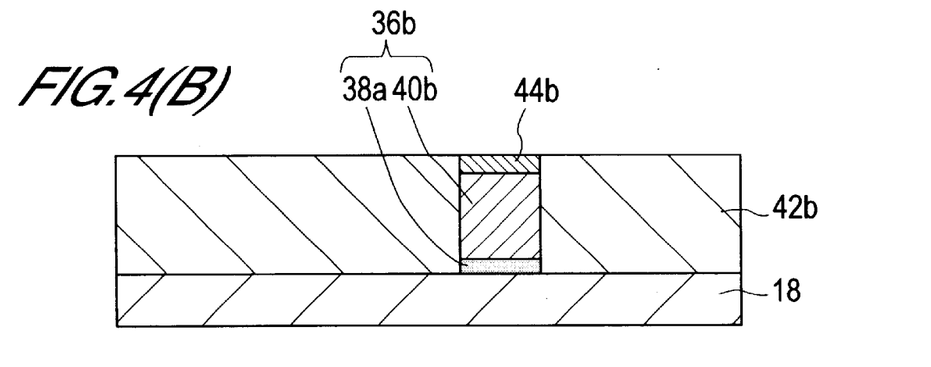
Figure 4C:
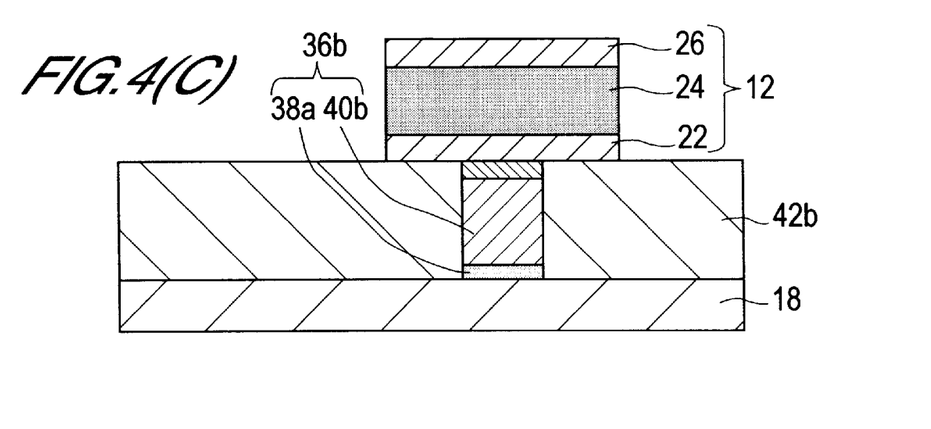

Next, the method for manufacturing the semiconductor memory device with the constitution discussed above is explained with reference to FIGS. 2, 3, and 4. FIGS. 2, 3, and 4 are cross sectional views showing the steps for manufacturing the semiconductor memory device relating to the first embodiment. Representation of the substrate 16 is omitted from FIGS. 2, 3, and 4.

Initially, a MOS transistor and wiring are formed on the substrate 16 and an interlayer insulating film 18 is formed on the surface thereof. Planarization of this interlayer insulating film 18 is then performed to remove surface irregularities. Thereafter, a first conductive layer 36 is built up on the substrate 16, meaning the upper surface of the interlayer insulating film 18 (FIG. 2(A)). Here, a two-layered structure comprising a TiN layer 38 and W layer 40 is formed as the first conductive layer 36.

A TiN layer 38 is formed on the upper surface of the interlayer insulating film 18 in the first place. For this purpose, a 100 nm thick Ti layer is formed with a usual sputtering method on the upper surface of the interlayer insulating film 18. Heat treatment is then performed in an 800° C. nitrogen atmosphere whereby this Ti layer is nitrided and a TiN layer 38 is obtained. Further, a 500 nm thick W layer 40 is formed with CVD or sputtering on the entire surface of this TiN layer 38.

Next, the first conductive layer 36 is patterned to form the wiring pattern 36a (FIG. 2(B)). For this purpose, the W layer 40 and TiN layer 38 are processed with known photolithography or dry etching methods. After patterning, the W layer 40a and TiN layer 38a have a pattern corresponding to the plate line.

Next, an insulating film 42 is formed on the substrate 16 whereon the wiring pattern 36a has been formed (specifically, the upper surface of the interlayer insulating film 18) (FIG. 2(C)). This insulating film 42 is formed by growing an $SiO_2$ film with CVD. The thickness of this $SiO_2$ film is sufficiently thicker than the W layer 40a so that the first conductive layer, meaning the wiring pattern 36a, is entirely covered by this $SiO_2$ film.

Next, the upper portion of the insulating film 42 is removed to expose the upper surface of the first conductive layer 36a (FIG. 3(A)). Here, the portion of the insulating film 42 located on the top of the first conductive layer 36a is polished with chemical mechanical polishing (CMP). The polishing is performed until the upper surface of the first conductive layer 36a is exposed. With CMP, the level of the upper surface of the first conductive layer 36a is made even with that of the upper surface of the insulating film 42a after polishing.

Next, the upper portion of the first conductive layer 36a is removed. The level of the upper surface of the first conductive layer 36b after removal is lower than that of the upper surface of the insulating film 42a (FIG. 3(B)). For this purpose, the upper surface of the W layer 40a is removed by a usual dry etching method. At this time, the upper surface of the W layer 40b after dry etching becomes 0.2 $\mu$m lower than the upper surface of the insulating film 42a. The W layer 40b and TiN layer 28a formed in this way become a constitution corresponding to the main wiring layer 28 explained with reference to FIG. 1.

Next, a second conductive layer 44, serving as a material impermeable to oxygen, is built up on portions from which the first conductive layer 36b was removed (FIG. 3(C)). For this purpose, an Ir layer, that is the second conductive layer 44, is formed to a thickness of 0.2 $\mu$m using a sputtering method. At this time, the thickness of the Ir layer may be equal to or greater than the depth of the trench in the insulating film 42a formed in the upper portion of the W layer 40b.

Next, the upper portions of the second conductive layer 44 and insulating film 42a are removed. After removal, the level of the upper surface of the second conductive layer 44b is the same as the level of the upper surface of the insulating film 42b (FIG. 4(B)). This process is divided into two steps and accomplished with CMP.

In the first step, portions of the second conductive layer 44 built up on the upper surface of the insulating film 42a are polished using a polishing pad as pure water is dripped, but without using a slurry. A pad with relatively low hardness, such as the Suba 400 (trade name) from Rodel-Nitta, is used as the polishing pad. CMP is performed using this pad and the prescribed portion of the second conductive layer 44 is removed. Because the adhesion between the Ir layer that is the second conductive layer 44 and the $SiO_2$ layer that is the insulating film 42a is poor, the second conductive layer 44 is easily peeled off from the insulating film 42a. Meanwhile, because the Ir layer and W layer 40b easily form an alloy, the adhesion is high and these are hardly isolated. Consequently, the second conductive layer 44a remains only on the upper surface of the W layer 40b (FIG. 4(A)). Scrub washing is then performed and particles generated in the polishing process are removed.

Subsequently, in the second step, CMP is performed using an ammonia-based slurry. A pad with relatively high hardness, such as the IC 1400 (trade name) from Rodel-Nitta, is used as the polishing pad. The surface of the remaining second conductive layer 44a and insulating film 42a is polished. Damage from the previous step and surface irregularities of the second conductive layer 44a are removed by CMP. The level of the upper surface of the second conductive layer 44b after polishing matches that of the upper surface of the insulating film 42b after polishing (FIG. 4(B)). This second conductive layer 44b corresponds to the constitution of the barrier metal layer 30 explained with reference to FIG. 1.

In the present embodiment, Ir is used as the second conductive layer 44. This second conductive layer 44 may also comprise alloys or compounds of Ir. Furthermore, Pt may be used as the second conductive layer 44 as discussed above. Pt also functions effectively as a barrier to oxygen diffusion. Because Pt has poor adhesion to $SiO_2$, the second conductive layer 44 and insulating film 42a are easily peeled off.

Next, the lower electrode 22, ferroelectric film 24, and upper electrode 26 are built up to form the capacitive element 12 on the upper surface of the second conductive layer 42b (FIG. 4(C)). In this example, the lower electrode 22 and upper electrode 26 are formed with $IrO_2$ and the ferroelectric film 24 is formed with SBT. The lower electrode 22 and upper electrode 26 are formed by a method such as sputtering. To form the ferroelectric film 24, SBT is applied to the lower electrode 22 with the Sol-Gel method, for example. Thereafter, heat treatment at 450° C. is performed for one hour in oxygen for provisional calcination. Furthermore, for the main calcination, heat treatment at 750° C. is performed for one hour in oxygen. At this time, oxygen diffuses through the lower electrode 22 ($IrO_2$ layer), but the W layer 40b is not oxidized because the second conductive layer 44b (Ir layer) is formed as a barrier metal.

Using W as the main wiring layer is suitable for the following reasons.

W has a smaller coefficient of linear expansion than Pt. In other words, the linear expansion coefficients of W and Pt are $4.5 \times 10^{-6}$/K and $8.9 \times 10^{-6}$/K, respectively. Just for reference, the linear expansion coefficients of the Si and $SiO_2$ used in LSI processing are $2.4 \times 10^{-6}$/K and $4 \times 10^{-6}$/K respectively. Consequently, W has less thermal stress than Pt and is appropriate as a wiring material that withstands high temperature processing. Also, it is easy to use as wiring for portions other than FeRAM memory cells.

Furthermore, the resistivity of a W film formed with a usual CVD method is 10 $\mu$106 cm, approximately the same as a Pt film. Generally, it is necessary to increase the film thickness of the wiring used as the plate line of the FeRAM or the like to reduce the wiring resistance. In the wiring in the present embodiment, even if the W layer 40b is thick, it costs less than Pt wiring, for which the materials are expensive.

Usually the processing of the $IrO_2$ film used as the lower electrode 22 is effected with dry etching using chlorine gas. The Ir layer 44b formed as the barrier metal layer 30 is not removed by this etching because it does not react with chlorine. Consequently, the consistent wiring structure of the main wiring layer 28 can be maintained.

As explained in the present embodiment, the processing of the barrier metal layer 30 is effected with CMP and therefore, microfinishing is possible even if the barrier metal material is not easily dry etched.

As explained above, a wiring structure wherein the upper portion of the tungsten (W) wiring is covered with barrier metal material is realized with the manufacturing method of the present embodiment. Consequently, it is enabled to provide wiring that does not easily oxidize during heat treatment in oxygen and for which the electrical properties do not deteriorate. Because tungsten is used as the wiring material, wiring can be attained at lower costs than when Pt is used. Furthermore, the barrier metal material that is not easily dry etched can be microprocessed with CMP. Also, the growth of the wiring material can be effected with just a sputtering method and without using CVD.

Second Embodiment

Figure 5:
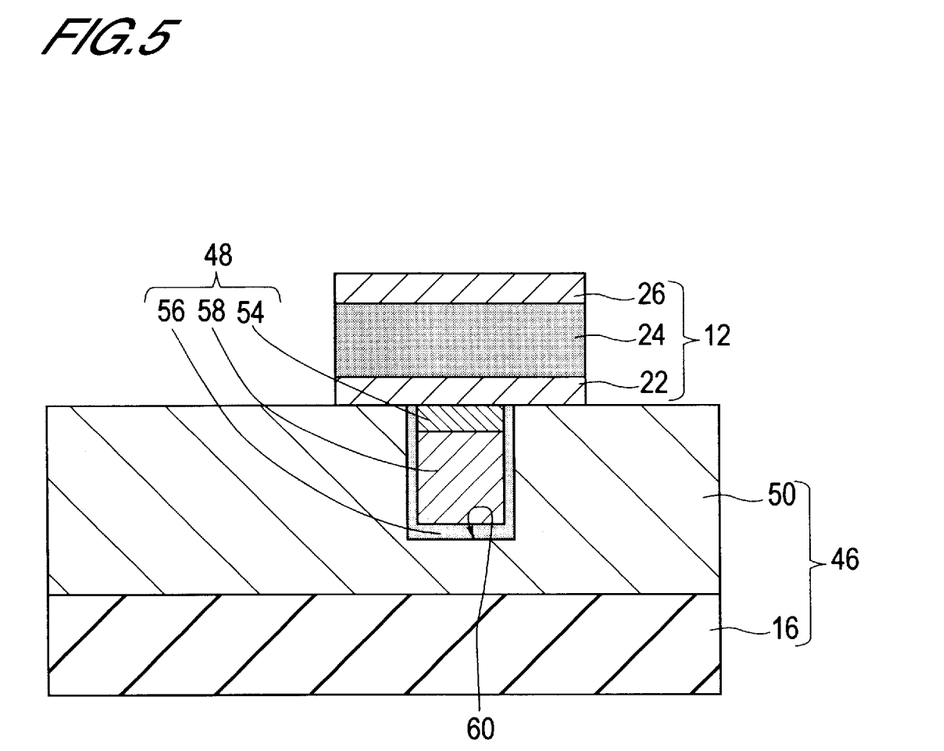
FIG. 5 is a cross sectional view showing the constitution of the semiconductor memory device relating to the second embodiment.

Next, the constitution of the semiconductor memory device relating to the second embodiment is explained. FIG. 5 is a cross sectional view showing the principal elements constituting the semiconductor memory device relating to the second embodiment. As shown in FIG. 5, the semiconductor memory device comprises a base 46, capacitive element 12, and wiring structure 48. The base 46 comprises a substrate 16 and interlayer insulating film 50. The substrate 16 is a semiconductor substrate such as Si, for example. A control element, such as a MOS transistor (not shown) and wiring are formed on the substrate 16. The surface of this substrate 16 is covered with an interlayer insulating film 50 formed of an appropriate material such as $SiO_2$.

Like the first embodiment, the capacitive element 12 discussed above is established on the upper surface of the base 46 and comprises a lower electrode 22, ferroelectric film 24, and upper electrode 26 layered in that order. Specifically, the lower electrode 22 is formed on the interlayer insulating film ($SiO_2$ film) 50; and the ferroelectric film 24 is layered on the upper surface of the lower electrode 22. Then, the upper electrode 26 is layered on the upper surface of the ferroelectric film 24. In this example, both the lower electrode 22 and the upper electrode 26 are formed of $IrO_2$ and the ferroelectric film 24 is formed of SBT.

Also, the wiring structure 48 comprises a main wiring layer 58, barrier metal layer 54 and TiN layer 56, each established in the base 46, and is connected to the lower electrode 22. The wiring structure 48 in this example is formed in a trench 60 formed in the interlayer insulating film 50. The depth of this trench 60 is smaller compared to the thickness of the interlayer insulating film 50. The above-mentioned TiN layer 56 is formed on the side wall surface and bottom surface in the trench 60. The W layer 58 is formed on the surface of the TiN layer 56. The thickness of the W layer 58 is less than the depth of the trench 60. The barrier metal layer 54 is then formed on the upper surface of the W layer 58. The level of the upper surface of this barrier metal layer 54 matches the level of the upper surface of the interlayer insulating film 50. The abovementioned lower electrode 22 is established above this barrier metal layer 54. The upper surface of the barrier metal layer 54 is in contact with the lower surface of the lower electrode 22.

The main wiring layer 58 may be a monolayered film of a single layer selected from among the following, or a multilayered film of a plurality of layers arbitrarily selected from among the following: W layer, Mo layer, Ta layer, Cu layer, $TiSi_2$ layer, $CoSi_2$ layer, $ZrSi_2$ layer, $WSi_2$ layer, $TaSi_2$ layer, $MoSi_2$ layer, polysilicon layer, TiN layer, ZrN layer, and TaN layer. With the use of such materials, costs are lower than when Pt is used.

Because the semiconductor memory device relating to the present embodiment has the constitution as explained above, the main wiring layer 52 and lower electrode 22 are isolated from each other by a barrier metal layer 54. The barrier metal layer 54 acts as a material impermeable to oxygen. In other words, oxygen cannot pass through the barrier metal layer 54. Accordingly, oxygen does not diffuse into the lower electrode 22 during heat treatment performed during the manufacturing process and the electrical properties thereof deteriorate with difficulty. The barrier metal layer 54 in this example is formed of Ir. The barrier metal layer 54 is not limited to that and may also be formed of other materials so long as it is a layer including Ir or Pt.

Figure 6A:
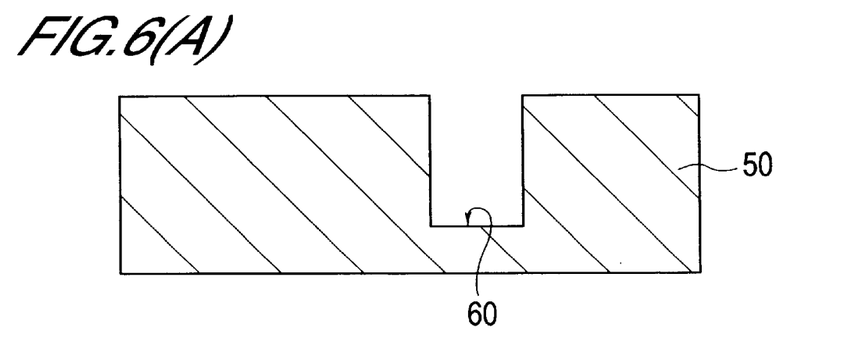
Figure 6B:
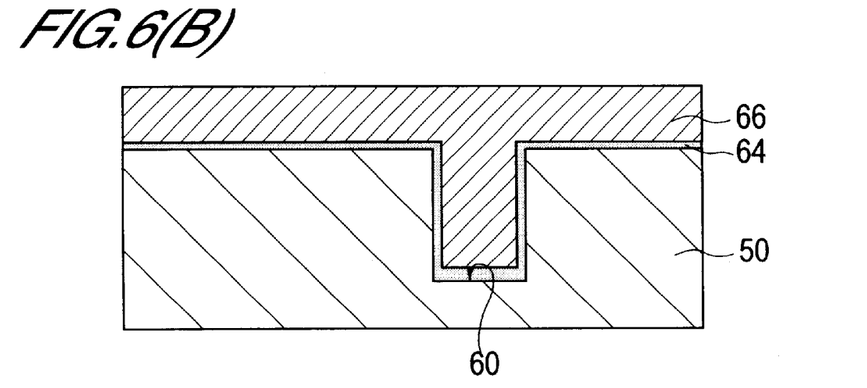
Figure 6C:
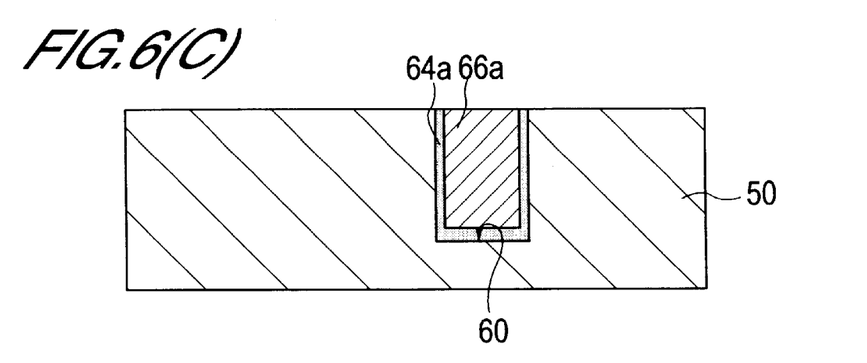
Figure 7A:
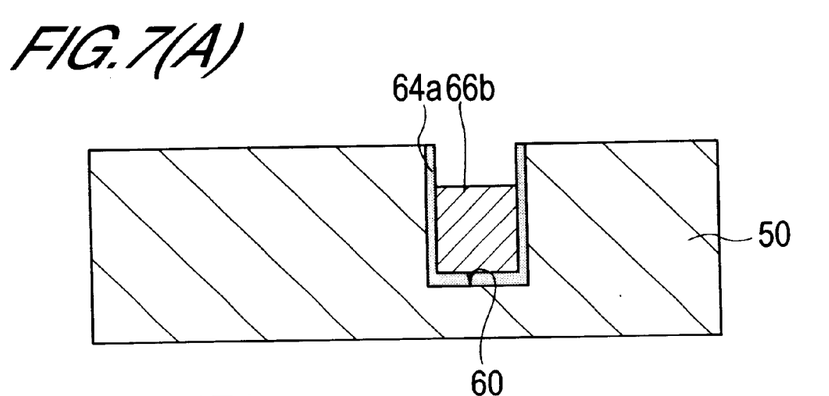
Figure 7B:
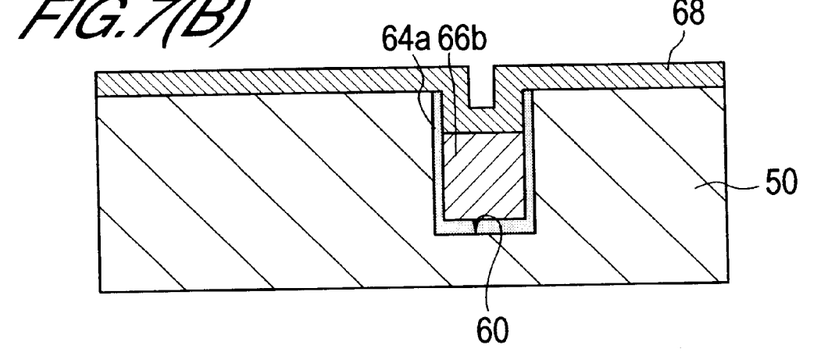
Figure 7C:
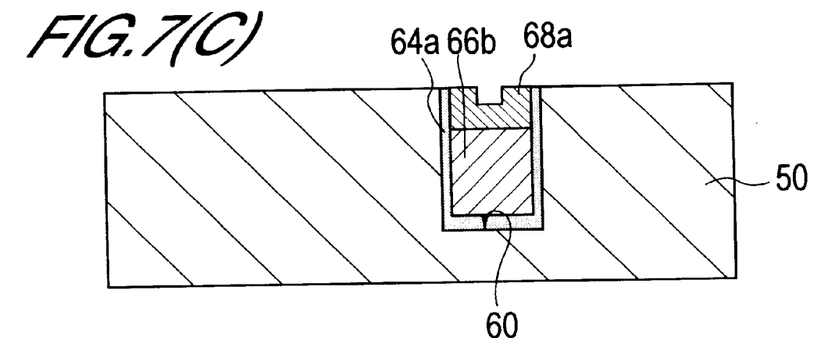
Figure 8A:
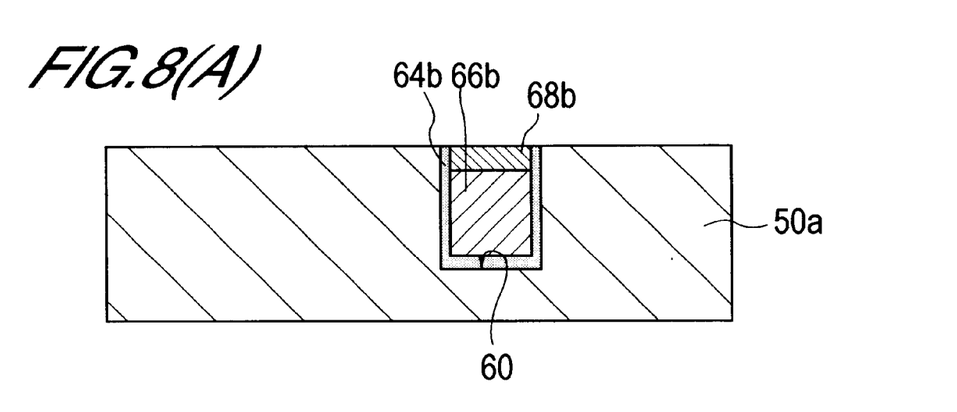
Figure 8B:
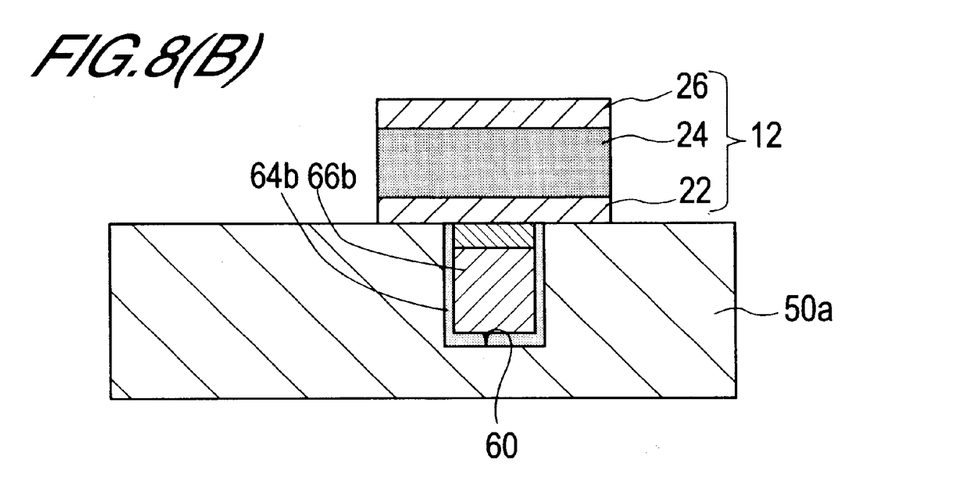

Next, the method for manufacturing the semiconductor memory device with the constitution discussed above is explained with reference to FIGS. 6, 7, and 8. FIGS. 6, 7, and 8 are cross sectional views showing the processes for manufacturing the semiconductor memory device relating to the second embodiment. Representation of the substrate 16 is omitted from FIGS. 6, 7, and 8.

First, a MOS transistor and wiring are formed on the substrate 16 and an interlayer insulating film 18 is grown on the surface thereof. Planarization of this interlayer insulating film 50 is then performed and surface irregularities are removed. Thereafter, a trench 60 is formed in the interlayer insulating film 50 according to a wiring pattern such as the plate line (FIG. 6(A)). This trench 60 is formed with usual photolithography and dry etching methods. Because conductive material is embedded and wiring formed in this trench 60, the depth of the trench 60 is equal to the thickness of the wiring. In the present embodiment, the depth of the trench 60 is 500 nm.

Next, the first conductive layer 66 is built up on the interlayer insulating film 50 wherein the trench 60 has been formed (FIG. 6(B)).

The TiN layer 64 is formed on the upper surface of the interlayer insulating film 50. For this purpose, a 100 nm thick Ti layer is formed with a usual sputtering method on the upper surface of the interlayer insulating film 50. Then this Ti layer is nitrided by heat treatment in a nitrogen atmosphere at 800° C. to obtain the TiN layer 64. Furthermore, as the first conductive layer 66, a 500 nm thick W layer 66 is formed on the entire surface of this TiN layer 64 with CVD or sputtering. At this time, the W layer 66 is formed to an appropriate thickness so that the trench 60 formed in the interlayer insulating film 50 is covered with this W layer 66.

Next, the upper portion of this first conductive layer 66 is removed. The level of the upper surface of the first conductive layer 66 after removal is lower than that of the upper surface of the interlayer insulating film 50 (FIG. 7(A)). This process is divided into two steps and accomplished with CMP.

In the first step, the upper portions of the W layer 66 and TiN layer 64 are polished until the surface of the interlayer insulating film 50 is exposed. As shown in FIG. 6(C), the level of the upper surface of the first conductive layer 66a (W layer 66a) and TiN layer 64a after polishing match the level of the upper surface of the interlayer insulating film 50.

Next, in the second step, the upper portion of the W layer 66a is removed by dry etching. The level of the upper surface of the W layer 66b after removal is 0.2 μm less than that of the upper surface of the interlayer insulating film 50 (FIG. 7(A)). At this time, part of the TiN layer 64a remaining in the trench 60 and on the upper portion of the W layer 66b may also be removed. In this example, part of this TiN layer 64a remains. The W layer 66b formed in this way has a constitution corresponding to the main wiring layer 58 explained with reference to FIG. 5.

Next, the second conductive layer 68, to serve as the material impermeable to oxygen, is built up on the portion from which the first conductive layer 66b was removed (FIG. 7(B)). For this purpose, the Ir layer as the second conductive layer 68 is formed to a thickness of 0.2 μm with sputtering. At this time, the thickness of the Ir layer may be equal to or greater than the depth of the trench in the interlayer insulating film 50 formed in the upper portion of the W layer 66b.

Next, the upper portion of the second conductive layer 68 and interlayer insulating film 50 are removed; the level of the upper surface of the second conductive layer 68b after removal matches that of the upper surface of the interlayer insulating film 50a (FIG. 8(A)). This process is divided into two steps and accomplished with CMP.

In the first step, portions of the second conductive layer 68 built up on the upper surface of the interlayer insulating film 50 are polished using a polishing pad as pure water is dripped, but without using a slurry. A pad with relatively low hardness, such as the Suba 400 (trade name) from Rodel-Nitta, is used as the polishing pad. CMP is performed using this pad and the prescribed portion of the second conductive layer 68 is removed. The adhesion between the Ir layer that is the second conductive layer 68 and the $SiO_2$ layer that is the interlayer insulating film 50 is poor, so the second conductive layer 68 is easily peeled off from the interlayer insulating film 50. Meanwhile, because the Ir layer and W layer 66b easily form an alloy, the adhesion is high and these are hardly separated. Consequently, the second conductive layer 68a remains only on the upper surface of the W layer 66b (FIG. 7(C)). Scrub washing is then performed and particles generated in the polishing process are removed.

Subsequently, in the second process, CMP is performed using an ammonia-based slurry. A pad with relatively high hardness, such as the IC 1400 (trade name) from Rodel-Nitta, is used as the polishing pad. The surface of the remaining second conductive layer 68a, TiN layer 64a, and interlayer insulating film 50 is polished. Damage from the previous process and surface irregularities of the second conductive layer 68a are removed by CMP. The level of the upper surface of the second conductive layer 68b and the level of the upper surface of the TiN layer 64b after polishing match that of the upper surface of the interlayer insulating film 50a after polishing (FIG. 8(A)). The second conductive layer 68b attained in this way corresponds to the constitution of the barrier metal layer 54 explained with reference to FIG. 5.

In the present embodiment, Ir is used as the second conductive layer 68. This second conductive layer 68 may also be composed of alloys or compounds of Ir. Furthermore, Pt may be used as the second conductive layer 68 as discussed above. Pt also functions effectively as a barrier to oxygen diffusion. Because Pt has poor adhesion to SiO$_2$, the second conductive layer 68 and interlayer insulating film 50 can be peeled off.

Next, the lower electrode 22, ferroelectric film 24, and upper electrode 26 are built up to form the capacitive element 12 on the upper surface of the second conductive layer 68b FIG. 8(B)). In this example, the lower electrode 22 and upper electrode 26 are formed with IrO$_2$ and the ferroelectric film 24 is formed with SBT. The lower electrode 22 and upper electrode 26 are formed by a method such as sputtering. To form the ferroelectric film 24, SBT is applied to the lower electrode 22 with the Sol-Gel method, for example. Thereafter, heat treatment at 450° C. is performed for one hour in oxygen for provisional calcination. Furthermore, for the main calcination, heat treatment at 750° C. is performed for one hour in oxygen. At this time, oxygen diffuses through the lower electrode 22 (IrO$_2$ layer), but the W layer 66b is not oxidized because the second conductive layer 68b (Ir layer) is formed as a barrier metal.

As explained above, a wiring structure wherein the upper portion of the tungsten (W) wiring is covered with barrier metal material is realized with the manufacturing method of the present embodiment. Consequently, wiring that does not easily oxidize during heat treatment in oxygen and for which the electrical properties do not deteriorate can be realized. Because tungsten is used as the wiring material, wiring is attained at lower costs than when Pt is used. Furthermore, the barrier metal material that is not easily dry etched can be microprocessed with CMP. Also, the growth of the wiring material can be effected with just a sputtering method and without using CVD. Moreover, the processing is simpler than the method used in the first embodiment.

The abovementioned embodiments showed examples of FeRAM using a ferroelectric capacitor; however, the methods explained in each embodiment may also be applied to forming capacitors for DRAM.

What is claimed is:

1. A semiconductor memory device comprising:
   a base including a substrate, an interlayer insulating film, and another insulating film;
   a capacitive element including a lower electrode being provided on an upper surface of said base; and
   a wiring structure including a main wiring layer, the main wiring layer comprising a multilayered film of a plurality of layers selected from among a W layer, a Mo layer, a Ta layer, a Cu layer, a TiSi2 layer, a CoSi2 layer, a ZrSi2 layer, a WSi2 layer, a TaSi2 layer, a MoSi2 layer, a polysilicon layer, a TiN layer, a ZrN layer, and a TaN layer,
   the main wiring layer being provided in said base and being formed on an upper surface of said interlayer insulating film, the main wiring layer having side surfaces covered by said other insulating film, the wiring structure further including a barrier metal layer being provided in said base and being connected to said lower electrode, the barrier metal layer acting as a material impermeable to oxygen and having side surfaces covered by said other insulating film, the barrier metal being layered on an upper surface of said main wiring layer, wherein
      said main wiring layer and said lower electrode are isolated from each other by said barrier metal layer, and wherein the upper surface of said other insulating film and the upper surface of said barrier metal layer comprise matching levels and the interlayer insulating film extends over substantially an entire bottom surface of said main wiring layer.

2. The semiconductor memory device according to claim 1, wherein said capacitive element comprises a ferroelectric film and upper electrode layered in that order on the upper surface of said lower electrode.

3. The semiconductor memory device according to claim 1, wherein said barrier metal layer comprises a layer containing at least one of Ir and Pt.

4. The semiconductor memory device according to claim 1, wherein said plurality of layers comprise a TiN layer at a bottom of said main wiring layer.

5. The semiconductor memory device according to claim 1, wherein said plurality of layers comprise a TiN layer at a bottom and a side of said wiring structure.

6. The semiconductor memory device according to claim 2, wherein side surfaces of said lower electrode, said upper electrode and said ferroelectric film are connected continuously.

* * * * *